United States Patent
Issler

(10) Patent No.: US 7,341,648 B2
(45) Date of Patent: Mar. 11, 2008

(54) METHOD FOR COATING PISTON RINGS FOR INTERNAL COMBUSTION ENGINE

(75) Inventor: Wolfgang Issler, Schwaikheim (DE)

(73) Assignee: MAHLE GmbH, Stuttgart (DE)

( * ) Notice: Subject to any disclaimer, the term of this patent is extended or adjusted under 35 U.S.C. 154(b) by 206 days.

(21) Appl. No.: 10/536,656

(22) PCT Filed: Nov. 27, 2003

(86) PCT No.: PCT/DE03/03930

§ 371 (c)(1), (2), (4) Date: Aug. 15, 2005

(87) PCT Pub. No.: WO2004/050937

PCT Pub. Date: Jun. 17, 2004

(65) Prior Publication Data

US 2006/0042928 A1    Mar. 2, 2006

(30) Foreign Application Priority Data

Nov. 30, 2002 (DE) .............................. 102 56 063

(51) Int. Cl.
C23C 14/34 (2006.01)
C23C 16/452 (2006.01)

(52) U.S. Cl. .................... 204/192.11; 427/8; 427/528; 427/530

(58) Field of Classification Search ........... 204/192.11; 427/523, 530, 528, 8
See application file for complete search history.

(56) References Cited

U.S. PATENT DOCUMENTS 3,917,290 A * 11/1975 Geffroy ...................... 277/448
4,535,683 A * 8/1985 Dworak et al. ............... 92/224
4,619,865 A * 10/1986 Keem et al. ................ 428/333
5,449,547 A * 9/1995 Miyazaki et al. ........... 428/217
5,582,414 A   12/1996 Miyazaki et al.
5,672,386 A * 9/1997 Ooya ......................... 427/250
5,743,536 A   4/1998 Komuro et al.

(Continued)

FOREIGN PATENT DOCUMENTS

DE      30 40 572      5/1982

(Continued)

Primary Examiner—Bret Chen
(74) Attorney, Agent, or Firm—Collard & Roe, P.C.

(57) ABSTRACT

The invention relates to a method for coating piston rings (10) for internal combustion engines, wherein at least the bearing surface of the piston ring is provided with an anti-abrasion and anti-corrosion coating (12) by means of a PVD or electroplating process. According to said method, the anti-abrasion and anti-corrosion coating is prevented from flaking or cracking caused by strain occurring on the piston ring during the operation of the motor by means of the following steps: a) coating parameters are set; b) an uncoated piston ring (18) is pre-stressed in order to obtain a predetermined diameter (06) thereof or opening width (10); an ion coating process is carried out using coating parameters according to step a); the internal stress of the anti-abrasion or anti-corrosion coating (12) is measured in state (b); e) a new, uncoated piston ring (10) is subjected to tensile pre-stressing or compressive strain according to the measured internal tension of the coating; and f) the piston ring is coated (10) according to the coating parameters according to step a).

9 Claims, 1 Drawing Sheet

U.S. PATENT DOCUMENTS

Figure 1:
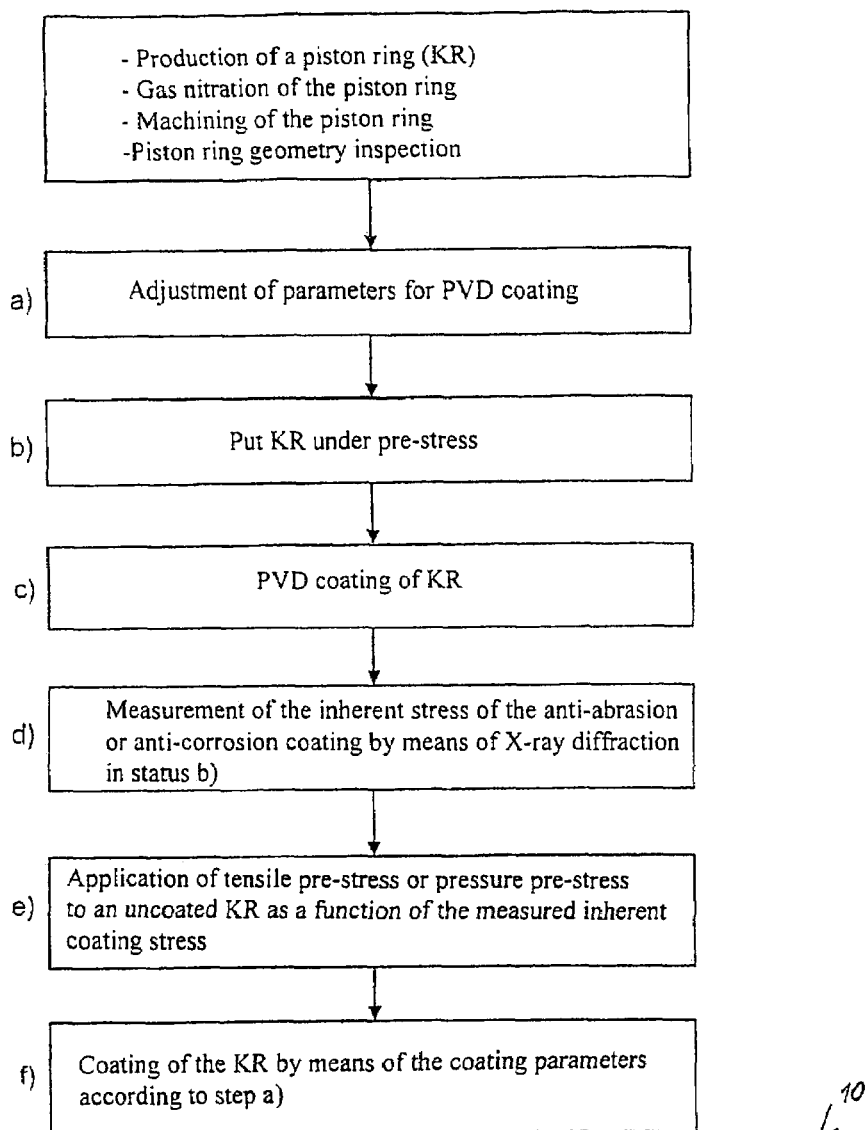

| | | |
|---|---|---|
| 5,851,659 A | 12/1998 | Komuro et al. |
| 6,631,907 B1 | 10/2003 | Onoda et al. |
| 6,886,521 B2 * | 5/2005 | Hamada et al. .......... 123/193.4 |
| 7,160,616 B2 * | 1/2007 | Massler et al. ............. 428/408 |
| 2004/0144318 A1 | 7/2004 | Beck et al. |

FOREIGN PATENT DOCUMENTS

| | | |
|---|---|---|
| DE | 41 12 422 D2 | 10/1991 |
| DE | 44 19713 A1 | 12/1994 |
| DE | 44 40 051 | 3/1996 |
| DE | 195 48 931 A | 7/1996 |
| DE | 19630149 C2 | 1/1997 |
| DE | 101 04 611 A1 | 8/2002 |
| EP | 0702 097 A | 3/1996 |
| EP | 1 087 031 A2 | 3/2001 |
| GB | 2243162 | 10/1991 |
| GB | 2303640 | 2/1997 |
| JP | 3 000954 | 1/1991 |
| JP | 10 068058 A | 3/1998 |

* cited by examiner

METHOD FOR COATING PISTON RINGS FOR INTERNAL COMBUSTION ENGINE

CROSS REFERENCE TO RELATED APPLICATIONS

Applicant claims priority under 35 U.S.C. §119 of German Application No. 102 56 063.3 filed on Nov. 30, 2002. Applicant also claims priority under 35 U.S.C. §365 of PCT/DE2003/003930 filed on Nov. 27, 2003. The international application under PCT article 21(2) was not published in English.

The invention relates to a method for coating a piston ring for internal combustion engines, consisting of steel or cast iron, in which at least the working surface of the piston ring is provided with an anti-abrasion or anti-corrosion coating by means of a coating process.

It is generally known that in order to extend the useful lifetime of internal combustion engines, the slide surfaces of the working partners piston ring/cylinder are provided with an abrasion-resistant coating of metal carbide or metal nitride, such as titanium carbide (TiC), titanium nitride (TiN), or chrome nitride (CrN, $Cr_2N$). The application of such coatings takes place, in most cases, by means of ion coating processes, particularly by means of physical vapor deposition (PVD), as described, for example, in DE 196 30 149 C2, by means of chemical vapor deposition (CVD), or by means of a galvanic coating process. The goal of coating the working surface is to improve the resistance of the coating to abrasion, seizing, peeling, and flaking, in order to meet the increasing thermal stresses in engine operation. Despite various measures that are supposed to improve the aforementioned resistance, for example in DE 41 12 422 C2, by means of an abrasion-resistant coating formed on a carrier material, which coating contains CrN and whose nitrogen concentration decreases continuously from the border surface between the carrier material and the coating, in the direction of the outer surface, it has been shown in engine operation that the CrN, $Cr_2N$, TiN or TiC coatings continue to have the tendency to peel off. It has been assumed until now that the cause is that the PVD coatings or galvanic coatings have high inherent stresses, and thereby their adhesion to the carrier material is poor. If, therefore, a thick coating is used, it should tend to peel off during operation. In fact, however, it has been found that peeling does not reach all the way to the piston ring as the carrier of the coating, or, if the piston ring is nitrided, does not take place to the nitride layer, but rather the peel-off edge or parting crack runs within the CrN, $Cr_2N$, TiN or TiC coating, in other words almost parallel to the carrier. As a result, measures that are only aimed at avoiding poor adhesion strength cannot prevent peeling, since according to current theory, the break should have to reach to the coating carrier, in each instance. Obviously, measures that take the inherent stress of the anti-abrasion layer that is applied into better consideration appear to be successful.

It is therefore the task of the invention to apply an anti-abrasion or anti-corrosion coating to the working surface of a piston ring of an internal combustion engine, in such a manner that low inherent stresses occur within the coating of the piston ring installed in the cylinder, i.e. under stress conditions during engine operation.

According to the invention, this task is accomplished in that at least the working surface of a piston ring is provided with an anti-abrasion or anti-corrosion coating by means of a coating process, particularly by means of a PVD process or galvanic process, in which, in a first step, the coating parameters are adjusted and fixed, subsequently a pre-stress is applied to an uncoated piston ring, so that the latter has a predetermined piston ring diameter; in another step, the PVD coating process is carried out using the coating parameters according to the first step, whereby afterwards, the inherent coating stress of the anti-abrasion or anti-corrosion coating is determined by means of X-ray diffraction. In another method step, a tensile pre-stress or pressure pre-stress is applied to new piston rings to be coated, as a function of the measured inherent coating stress, and subsequently, they are coated using the coating parameters of the first method step. In particular, in the case of a formation of an inherent pressure stress of the anti-abrasion or anti-corrosion coating, a pressure pre-stress is applied to the piston ring during the coating process, and in the case of an inherent tensile stress of the coating, a tensile pre-stress is applied during the coating process. It is advantageous, in this connection, if the pressure pre-stress is applied to the piston ring at the working surface, in that the total free gap at the piston ring joint is brought to a greater dimension, using suitable means and, in the case of applying a tensile pre-stress, in that the piston ring is brought to a smaller diameter, i.e. a lower total free gap, if necessary with overlapping joint ends.

The method offers the advantage that the inherent stresses that occur as a result of the coating process, in the anti-abrasion and anti-corrosion coating that is applied, in the assembled state of the piston ring in the cylinder, are reduced to a minimum and thereby peeling, flaking, or crack formation of the coating is prevented. In particular, the result is achieved that the strength of the coating is maintained under operating conditions, i.e. when the piston rings are installed in the cylinder of the engine. Advantageous further developments are the subject of the dependent claims.

Figure 2:
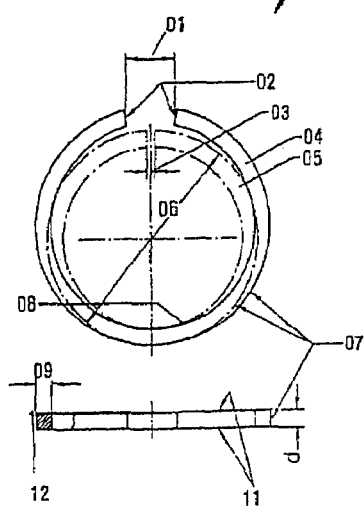

The invention is explained in greater detail below, using an exemplary embodiment. The drawing shows:

FIG. 1 a process flow chart of the method according to the invention;

FIG. 2 a schematic representation of a piston ring having an anti-abrasion and anti-corrosion coating, in two deformation states.

As is evident from the process flow chart according to FIG. 1, a piston ring 10, produced in known manner by means of winding from wire, cutting, grinding, relaxation annealing, working surface machining and ring side machining, which is subsequently subjected to a gas nitration process with subsequent repeated working surface machining, ring side machining, and joint end machining, is used for the method according to the invention. The piston ring 10 that has been brought to its geometric dimensions in such a manner has a tensile pre-stress applied to it at the outer circumference, which stress essentially corresponds to the installed state, in that the piston ring diameter 06 or the total free gap 01 of the piston ring 10 is adjusted to a measure corresponding to the predetermined pressure pre-stress, here 0.2 to 0.3 mm as compared with a non-stressed ring 04. By means of a clamping device (not shown), which clamps the piston ring 10 by way of its ring sides 11, the former is fixed in place accordingly. In the subsequent PVD coating process, which is known and considered to belong to the state of the art, the coating parameters, such as vacuum pressure, heating temperature and heating duration, $N_2$ gas flow, pre-stress, and cathode stream are adjusted. Using such established coating parameters, a CrN or $Cr_2N$ or TiN anti-abrasion or anti-corrosion coating 12 is applied to the working surface 07 of the piston ring 10, over the entire circumference, in a coating thickness from 28 to 30 μm.

Likewise, the anti-abrasion or anti-corrosion coating can also be applied by means of a known galvanic coating process, whereby the process parameters are also fixed.

After termination of the PVD or galvanic coating process, the inherent stress of the applied coating 12 is determined, without removing the piston ring 10 from its clamping device and thereby relaxing it, on the working surface side of the piston ring that lies opposite the ring joint. Depending on the inherent stress value that is determined (inherent pressure stress or inherent tensile stress), the total free gap 01 is increased or reduced accordingly for the piston rings to be coated. An increase in the total free gap 01 of the piston ring 10 takes place by means of a simple bracing device that is introduced into the interior of the piston ring and presses it apart to a dimension that corresponds to the predetermined tensile pre-stress. A reduction in the total free gap 01 takes place by means of a bracing device that reduces the outside diameter of the piston ring, whereby in a further step, the piston ring is fixed in this position by means of an axial clamping device. In this connection, the joint ends can also be structured to overlap and be fixed in place, if the measured inherent coating stresses require this.

A pile of uncoated, newly produced piston rings 10, stacked by way of their ring sides 11, whose ring joints 02 are disposed lying above one another, in the same position, is adjusted to the total free gap 01 corresponding to the inherent coating stress and coated by means of the fixed PVD coating parameters.

In order to achieve optimal inherent coating stresses with which flaking or crack formation of the anti-abrasion or anti-corrosion coating on the piston ring 10 can be effectively prevented, these stresses should lie in a range from (minus) −200 to (minus) −800 N/mm$^2$, measured in the status of the installed dimension (stressed piston ring).

| Reference Symbols | |
|---|---|
| Piston ring | 10 |
| Total free gap | 01 |
| Ring joint | 02 |
| Closed gap | 03 |
| Unstressed ring | 04 |
| Stressed ring | 05 |
| Diameter | 06 |
| Working surface | 07 |
| Ring back | 08 |
| Radial wall thickness | 09 |
| Ring sides | 11 |
| Anti-abrasion or anti-corrosion coating | 12 |
| Axial wall thickness (height) | d |

The invention claimed is:

1. A method for coating a steel or cast iron piston ring for internal combustion engines with an anti-abrasion or anti-corrosion coating on at least a working surface of the piston ring, comprising the following steps:
   a) bringing a first piston ring to a predetermined diameter or creating a predetermined gap in the first piston ring by applying a pre-stress to the first piston ring that equals the stress on the first piston ring that occurs in an installed state of the piston ring;
   b) carrying out an ion coating process on the first piston ring using predetermined coating parameters;
   c) measuring an inherent coating stress of the coating applied in step b);
   d) applying a tensile or pressure pre-stress to a second uncoated piston ring, said tensile or pressure pre-stress equivalent to the inherent coating stress measured in step c); and
   e) coating the second piston ring using the coating parameters used in step b).

2. A method according to claim 1, wherein in the case of an inherent pressure stress of the coating, the second piston ring has a pressure pre-stress applied to it at a ring circumference during process step f), and in the case of an inherent tensile stress of the coating, the second piston ring has a tensile pre-stress applied to it at the circumference.

3. A method according to 2, wherein the inherent coating stress has a value of −200 to −800 N/mm$^2$, after being coated, in an installed state of the piston ring in the cylinder of an engine.

4. A method according to claim 1, wherein application of the tensile or pressure pre-stress to the second piston ring takes place over an entire duration of the step of coating (e).

5. A method according to claim 1, wherein the measurement of the inherent coating stress is performed, after the step of coating (b), by means of X-ray diffraction.

6. A method according to claim 5, wherein the X-ray diffraction measurement takes place opposite a ring joint.

7. A method according to claim 1, wherein the coating is formed from CrN, Cr$_2$N, TiN or TiC.

8. A method according to claim 1, wherein the coating process is a PVD process.

9. A method according to claim 1, wherein the coating process is a galvanic process.

* * * * *